US006624015B2

(12) United States Patent
Patelmo et al.

(10) Patent No.: US 6,624,015 B2
(45) Date of Patent: *Sep. 23, 2003

(54) METHOD FOR MANUFACTURING ELECTRONIC DEVICES HAVING NON-VOLATILE MEMORY CELLS AND LV TRANSISTORS WITH SALICIDED JUNCTIONS

(75) Inventors: Matteo Patelmo, Trezzo sull' Adda (IT); Giovanna Dalla Libera, Monza (IT); Nadia Galbiati, Seregno (IT); Bruno Vajana, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 10/010,049

(22) Filed: Nov. 9, 2001

(65) Prior Publication Data

US 2002/0040993 A1 Apr. 11, 2002

Related U.S. Application Data

(62) Division of application No. 09/359,336, filed on Jul. 21, 1999, now Pat. No. 6,351,008.

(30) Foreign Application Priority Data

Jul. 22, 1998 (EP) .............................. 98830445
Oct. 22, 1998 (EP) .............................. 98120034

(51) Int. Cl.$^7$ ......................................... H01L 21/8238
(52) U.S. Cl. ...................... 438/201; 438/258; 438/593
(58) Field of Search ................................. 438/201, 211, 438/258, 266, 275, 592, 593, 594

(56) References Cited

U.S. PATENT DOCUMENTS

| 5,472,887 | A | | 12/1995 | Hutter et al. ............... 437/34 |
| 5,605,853 | A | | 2/1997 | Yoo et al. .................. 437/43 |
| 5,814,854 | A | | 9/1998 | Liu et al. ................... 257/315 |
| 5,888,869 | A | * | 3/1999 | Cho et al. .................. 438/258 |
| 5,953,611 | A | | 9/1999 | Tanaka ....................... 438/267 |
| 5,981,340 | A | | 11/1999 | Chang et al. ............... 438/258 |
| 6,020,229 | A | | 2/2000 | Yamane et al. ............. 438/201 |
| 6,023,085 | A | * | 2/2000 | Fang .......................... 438/266 |
| 6,171,927 | B1 | | 1/2001 | Sung et al. ................. 438/407 |
| 6,172,407 | B1 | | 1/2001 | Gardner et al. ............ 257/410 |
| 6,281,077 | B1 | * | 8/2001 | Patelmo et al. ............ 438/201 |

FOREIGN PATENT DOCUMENTS

| EP | 0 811 983 A1 | 12/1997 |
| JP | 09283643 | 10/1997 |

OTHER PUBLICATIONS

Haken, "Application of the self–aligned titanium silicide process to very large–scale integrated n–metal–oxide–semiconductor and complementary metal–oxide–semiconductor technologies," *J. Vac. Sci. Technolo. B*, 3(6):1657–1663, Nov./Dec. 1985.

Maex, "Self–aligned silicidation for sub half micro technologies," *Conference Proceedings ULSI–X, 1995 Materials Research Society*, pp. 405–414, 1995.

* cited by examiner

*Primary Examiner*—Chandra Chaudhari
(74) *Attorney, Agent, or Firm*—Lisa K. Jorgenson; E. Russell Tarleton; Seed IP Law Group PLLC

(57) ABSTRACT

The manufacturing method comprises, in sequence, the steps of: depositing an upper layer of polycrystalline silicon; defining the upper layer, obtaining LV gate regions of low voltage transistors and undefined portions; forming LV source and drain regions laterally to the LV gate regions; forming a layer of silicide on the LV source and drain regions, on the LV gate regions, and on the undefined portions; defining stack gate regions and HV gate regions of high-voltage transistors; and forming HV source and drain regions and cell regions.

12 Claims, 12 Drawing Sheets

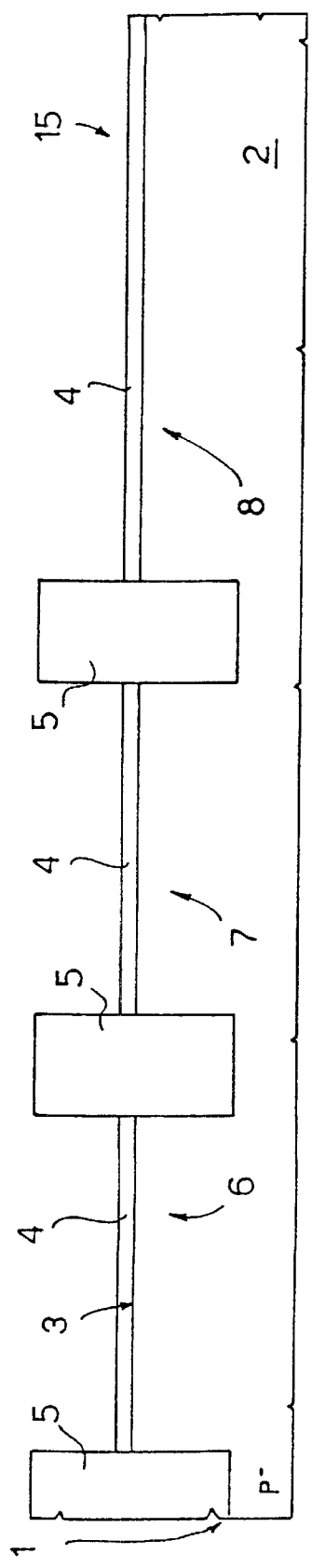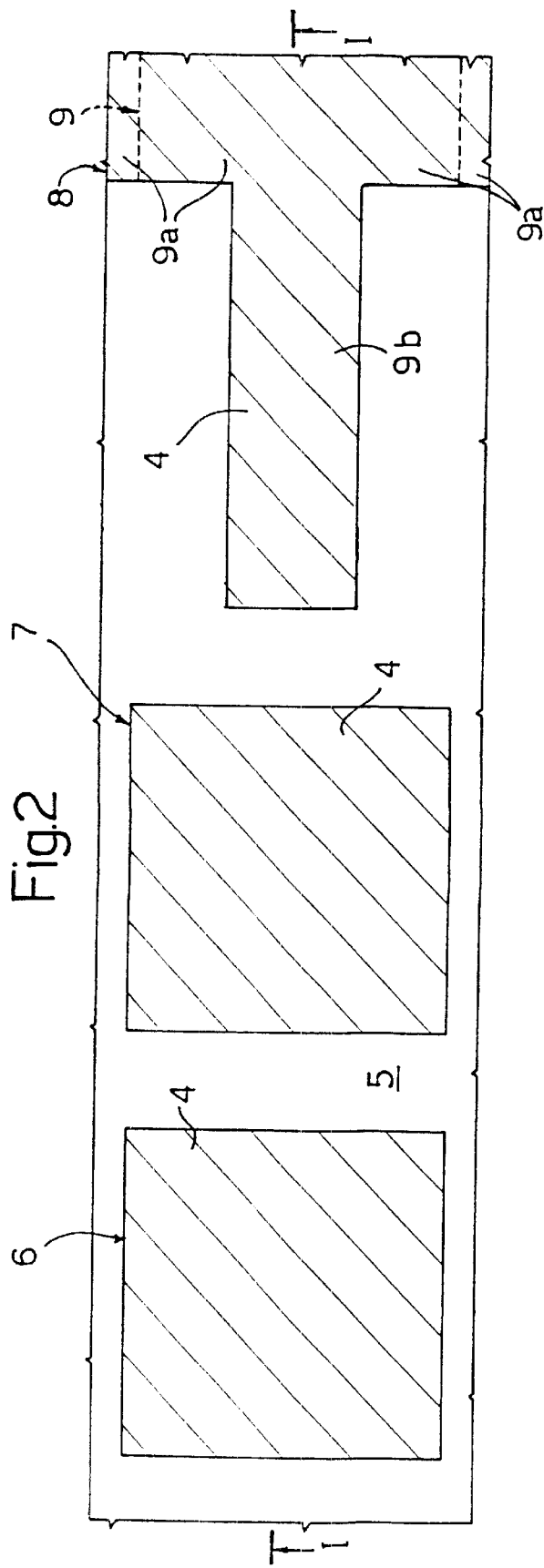

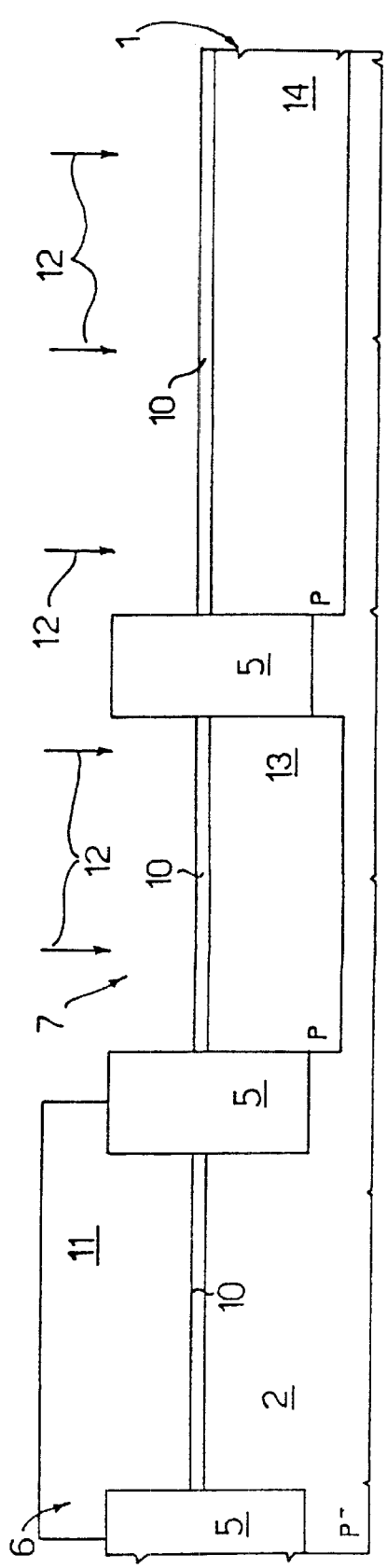
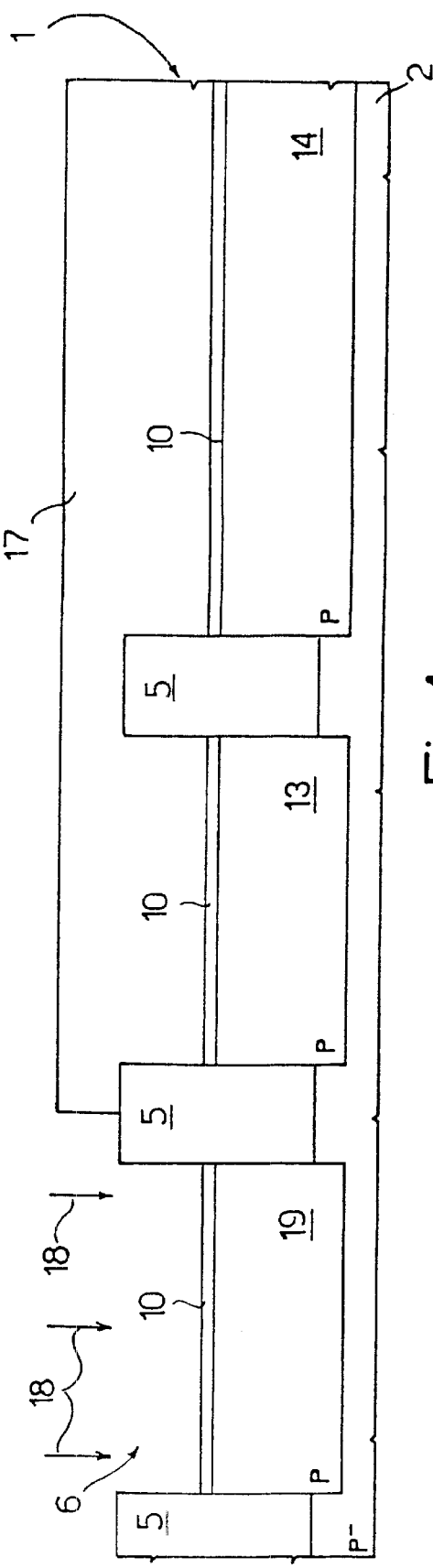

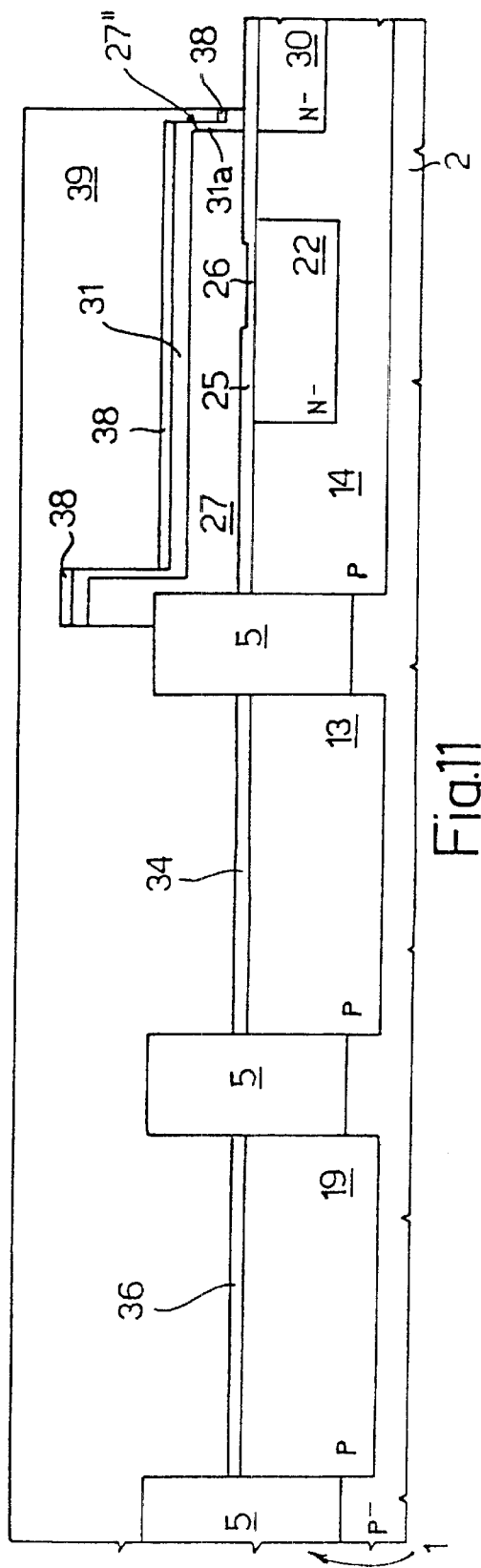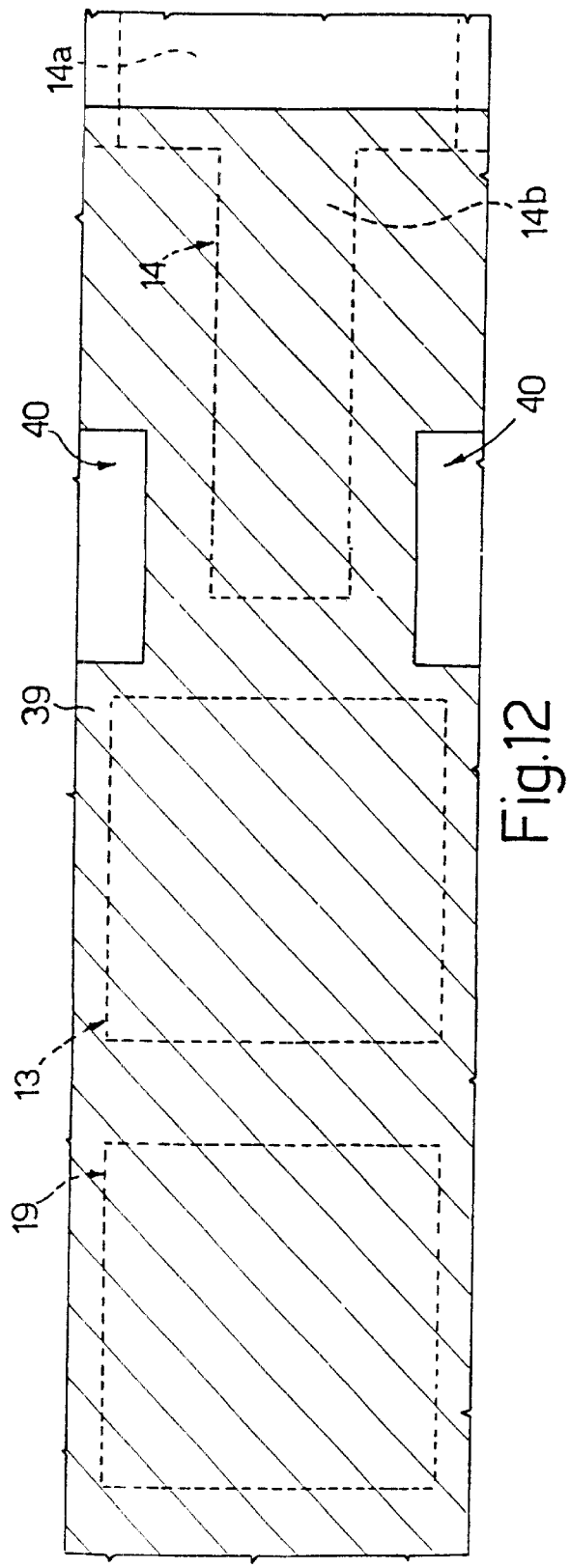
Fig.11
Fig.12

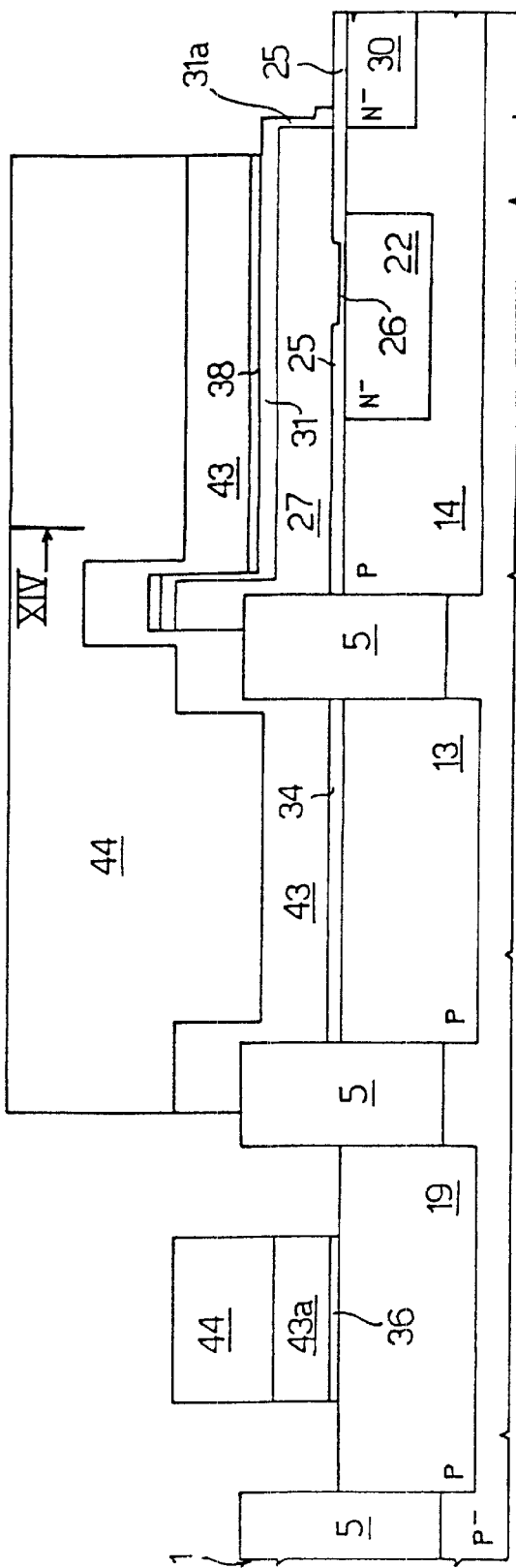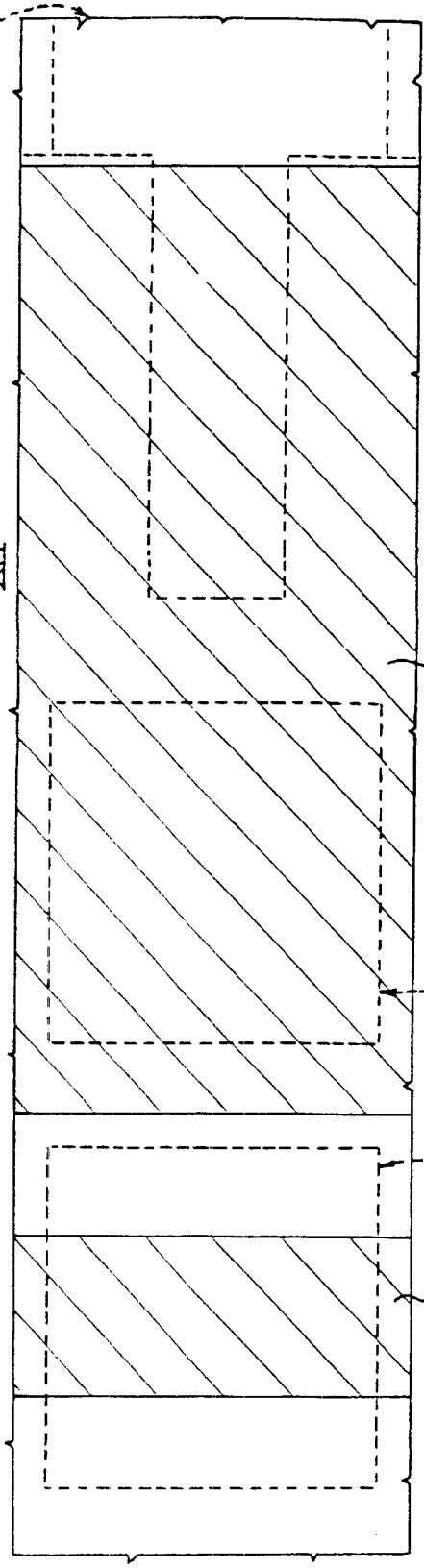
Fig.13
Fig.15

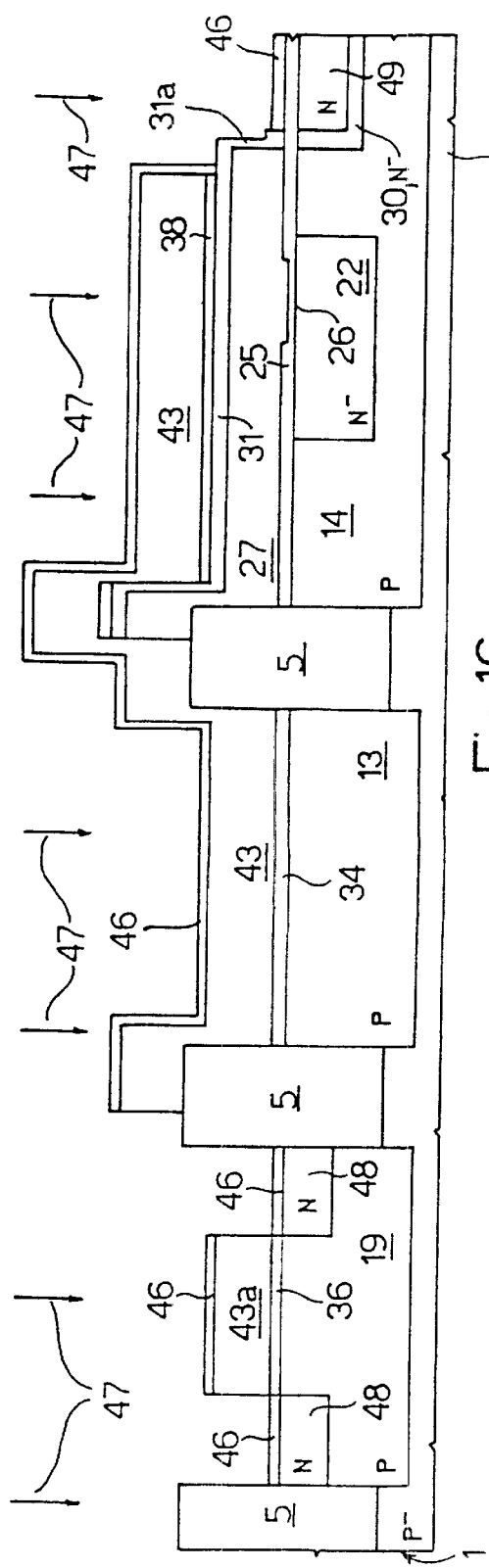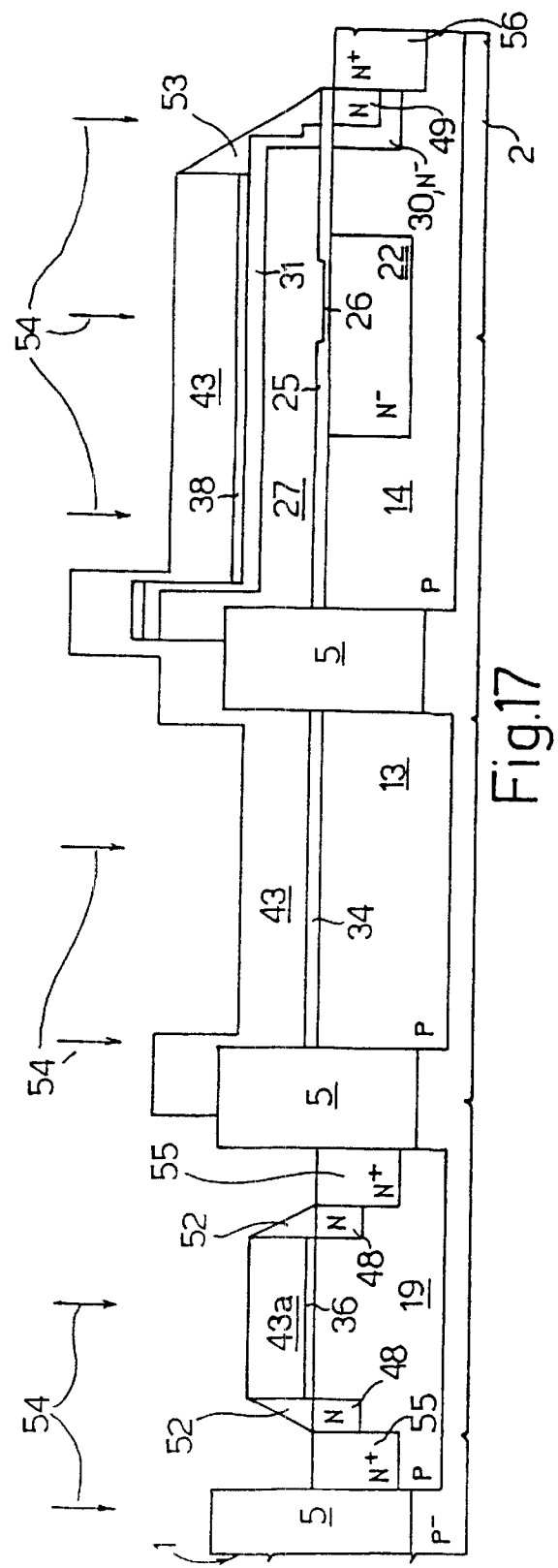

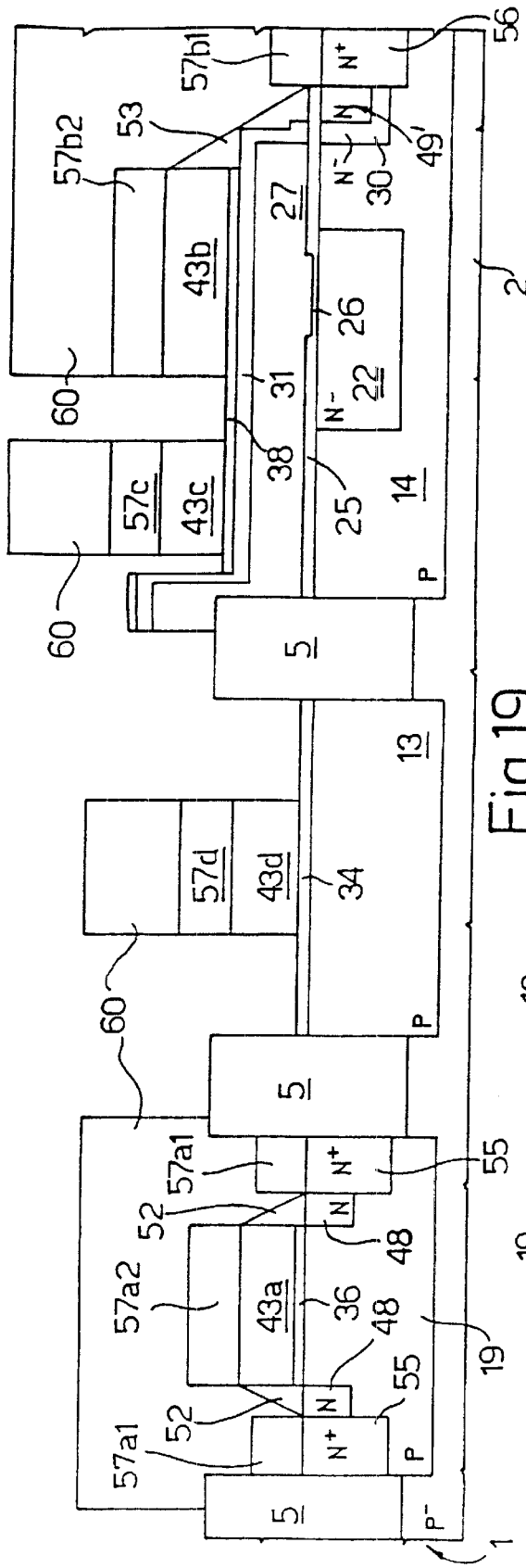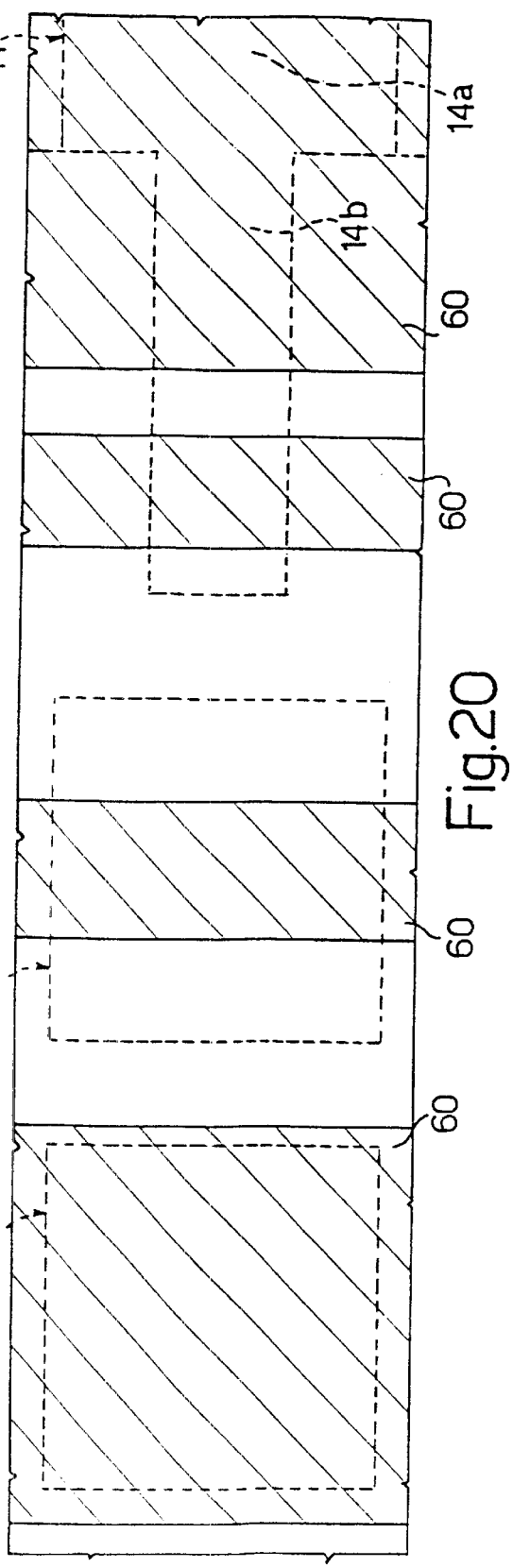

METHOD FOR MANUFACTURING ELECTRONIC DEVICES HAVING NON-VOLATILE MEMORY CELLS AND LV TRANSISTORS WITH SALICIDED JUNCTIONS

This application is a Divisional of U.S. patent application Ser. No. 09/359,336, now U.S. Pat. No. 6,351,008, filed Jul. 21, 1999.

TECHNICAL FIELD

The present invention relates to a method for manufacturing electronic devices, having non-volatile memory cells and LV transistors with salicided junctions.

BACKGROUND OF THE INVENTION

In advanced processes (gate lengths of 0.35 µm or less), the need has recently arisen to integrate EEPROM-type non-volatile memories in high-speed devices that use the technique of saliciding of the diffusions. As is known, this technique is based on the use of a layer of self-aligned silicide ("salicide"), which reduces the resistivity of the junctions. The salicide layer (typically of titanium, but also cobalt or another transition metal) is obtained by depositing a titanium layer on the entire surface of the device, and performing a heat treatment which makes the titanium react with the silicon, which is left bare on the junctions and the gate regions, such as to form titanium silicide. Subsequently, the non-reacted titanium (for example that is deposited on oxide regions), is removed by etching with an appropriate solution, which leaves the titanium silicide intact. Thereby, both the gate regions and the junctions have in parallel a layer of silicide with low resistivity (approximately 3–4 Ω/square), which makes it possible to reduce the resistance in series at the transistors. The salicide technique is described for example in the article "Application of the self-aligned titanium silicide process to very large-scale integrated n-metal-oxide-semiconductor and complementary metal-oxide-semiconductor technologies" by R. A. Haken, in J. Vac. Sci. Technol. B, vol 3, No. 6, November/December 1985.

The high voltages necessary for programming non-volatile memories (greater than 16 V) are however incompatible with saliciding of the diffusions of the memory cells, since the breakdown voltage of the salicided junctions is lower than 13 V.

Process flows are thus being designed which permit integration of non-volatile memory cells and high-speed transistors with saliciding; however this integration is made difficult by the fact that these components have different characteristics, and require different process steps.

SUMMARY OF THE INVENTION

The invention thus provides a method for manufacturing non-volatile cells and high-speed transistors, which is simple, and has the lowest possible costs.

According to the present invention, a method is provided for manufacturing electronic devices, such as non-volatile memory cells and LV transistors with salicided junctions. The invention also relates to an electronic device made with the foregoing method.

BRIEF DESCRIPTION OF THE DRAWINGS

For the understanding of the present invention, a preferred embodiment is now described, purely by way of non-limiting example, with reference to the attached drawings, in which:

FIG. 1 shows a cross-section through a silicon wafer, in an initial step of the manufacturing method according to the invention.

FIG. 2 shows a view from above of the wafer of FIG. 1.

FIGS. 3–7 show cross-sections similar to FIG. 1, in successive manufacturing steps.

FIGS. 9–11 show cross-sections similar to FIG. 7, in successive manufacturing steps.

FIG. 12 shows a view from above of the wafer of FIG. 11.

FIG. 13 shows a cross-section similar to FIG. 11, in a successive manufacturing step.

FIG. 15 shows a view from above of the wafer of FIG. 13.

FIGS. 16–19 show cross-sections similar to FIG. 13, in successive manufacturing steps.

FIG. 20 shows a view from above of the wafer of FIG. 19.

DETAILED DESCRIPTION OF THE INVENTION

Figure 5:
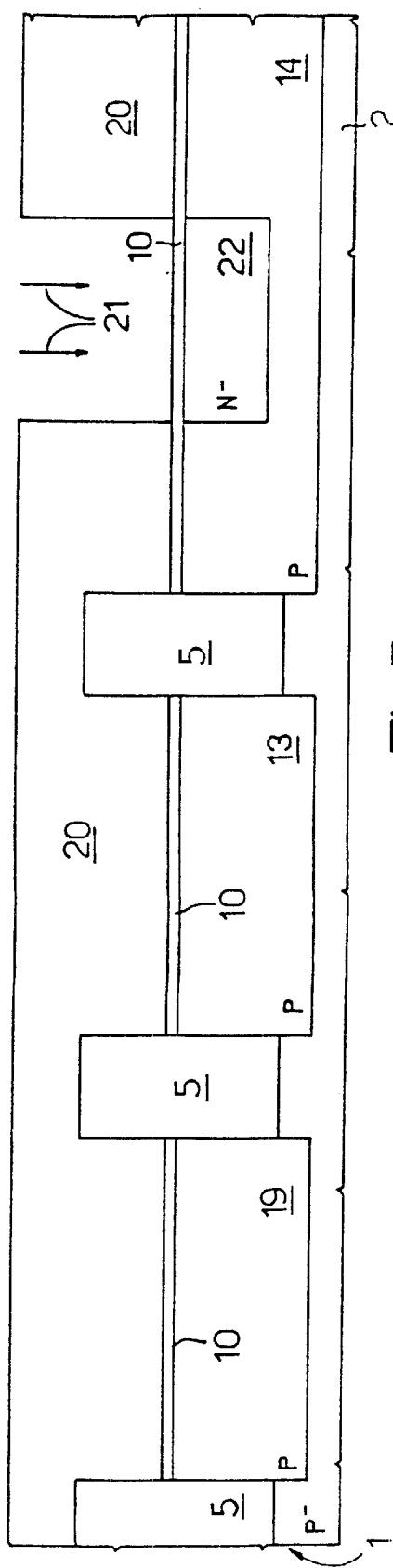

The following description relates to an embodiment for forming LV (low voltage and high speed) and HV (high voltage) NMOS transistors, LV and HV PMOS transistors, and EEPROM memory cells, comprising a selection transistor and a memory transistor. In particular, in view of the duality in manufacturing NMOS and PMOS transistors, the drawings show only the steps relating to NMOS transistors, and the steps relating to PMOS transistors are described in words alone. The EEPROM cells form a memory array and are produced in a part of the wafer which is also known hereinafter as array zone 15.

In FIG. 1, a wafer 1, formed from a monocrystalline silicon substrate 2, which here is of P-type, has been subjected to the steps of defining the active areas. In detail, with the surface 3 of substrate 2 covered by an active area mask 4 of non-oxidisable material (typically comprising a double layer of silicon oxide and silicon nitride, defined through resist), wafer 1 has been subjected to thermal oxidation; consequently, on the parts of substrate 2 which are not covered by active area mask 4, thick oxide (field oxide) layers 5 have been grown, which delimit between one another active areas of the substrate designed to accommodate the various components of the device to be formed. In particular, FIG. 1 shows three active areas, an active LV area 6, which is designed to accommodate an LV NMOS transistor, an active HV area 7, which is designed to accommodate an HV NMOS transistor, and an active array area 8, which is designed to accommodate EEPROM memory cells.

In detail, and in a known manner, active array area 8 defines a grid, of which FIG. 2 shows in full only the part of one cell, shown at 9, which has substantially the shape of a "T" rotated by 90°, and comprises a leg 9a (far from active HV area 7) and a cross-piece 9b. The leg 9a is adjacent, and is electrically connected, to corresponding legs 9a of other cells which are arranged above and below the shown cell, and of which only parts are shown; in addition, leg 9a is connected to a leg of an adjacent cell to the right (not shown), which has a structure which is symmetrical to that shown. The legs 9a are designed to accommodate source regions of the memory transistors; the end of cross-pieces 9b are designed to accommodate drain regions of the selection transistors and gate regions of the cells must be formed on the cross-pieces 9b. Further active areas are generally provided in order to produce LV or HV PMOS transistors, which are not shown in the drawings.

Subsequently the active area mask 4 is removed, oxidation of the free surface 3 of the substrate is carried out to form a sacrificial oxide layer 10, and masked implanting of doping ionic species of N-type is carried out, to form N-HV regions (not shown) for HV PMOS transistors; then, using an HV P-well resist mask 11 that covers the entire surface of wafer 1, except the HV active area 7 and the array area 8, implanting of doping ionic species of P-type is carried out, as shown schematically in FIG. 3 by arrows 12. In the substrate 2, P-HV regions 13 of P-type are thus formed for high-voltage transistors, and a P-array region 14, also of P-type, is formed for the cells, as shown in FIG. 3. P-HV region 13 and P-array region 14 reproduce exactly the shape of the respective HV active area 7 and array area 8, and thus, for each cell, legs 14a (corresponding to legs 9a of the cell active areas 9 of cell, see FIG. 8), and cross-pieces 14b (FIG. 8, corresponding to the cross-pieces 9b) are shown.

After HV P-well mask 11 has been removed, masked implanting of doping ionic species of N-type is carried out, to form N-LV regions (not shown) for LV PMOS transistors; then, using an LV P-well resist mask 17 which covers the entire surface of wafer 1, except for the LV active areas 6, implanting of doping ionic species of P-type is carried out, as shown schematically in FIG. 4 by arrows 18. In the substrate 2, P-LV regions 19 of P-type are thus formed for the LV NMOS transistors, as shown in FIG. 3. Thereby, P-HV regions 13 and P-LV regions 19 are separated from one another, and their electrical characteristics can be optimized to the required electrical characteristics.

After LV P-well mask 17 has been removed, a capacitor mask 20 is formed, which covers the entire surface of wafer 1, with the exception of strips perpendicular to the cross-pieces 14b. Implanting of doping species of N-type (for example phosphorous) is then carried out, as shown schematically in FIG. 5 by arrows 21. In the cross-pieces 14b continuity regions 22, of N-type, are thus formed which are necessary for electrical continuity between each selection transistor and the corresponding memory transistor of each cell. The structure in FIG. 5 is thus obtained.

Figure 6:
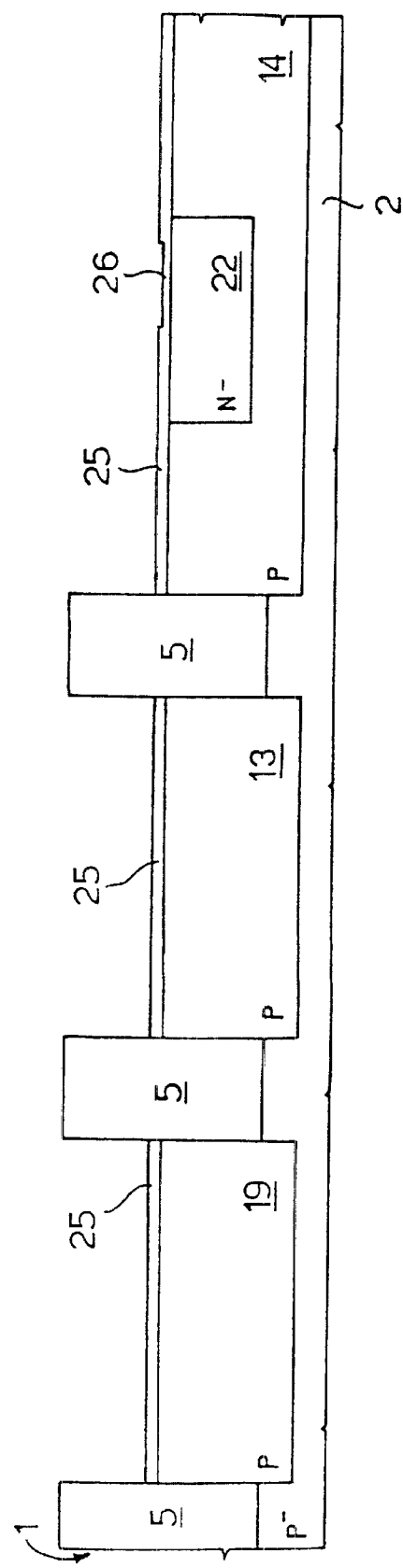

After capacitor mask 20 has been removed, wafer 1 is subjected to annealing, sacrificial layer 10 is removed, and array oxidation is carried out, which leads to the formation of an array oxide layer 25 on the surface of all the regions 13, 14 and 19 (FIG. 6). Then, using a tunnel mask, not shown, a small portion of the array oxide layer 25 is removed from above the continuity region 22; after the tunnel mask has been removed, wafer 1 is oxidized again, and in the zone where the array oxide 25 had been removed, a tunnel oxide region 26 with a thickness of approximately 80 Å is formed, in a known manner. The structure in FIG. 6 is thus obtained.

Figure 7:
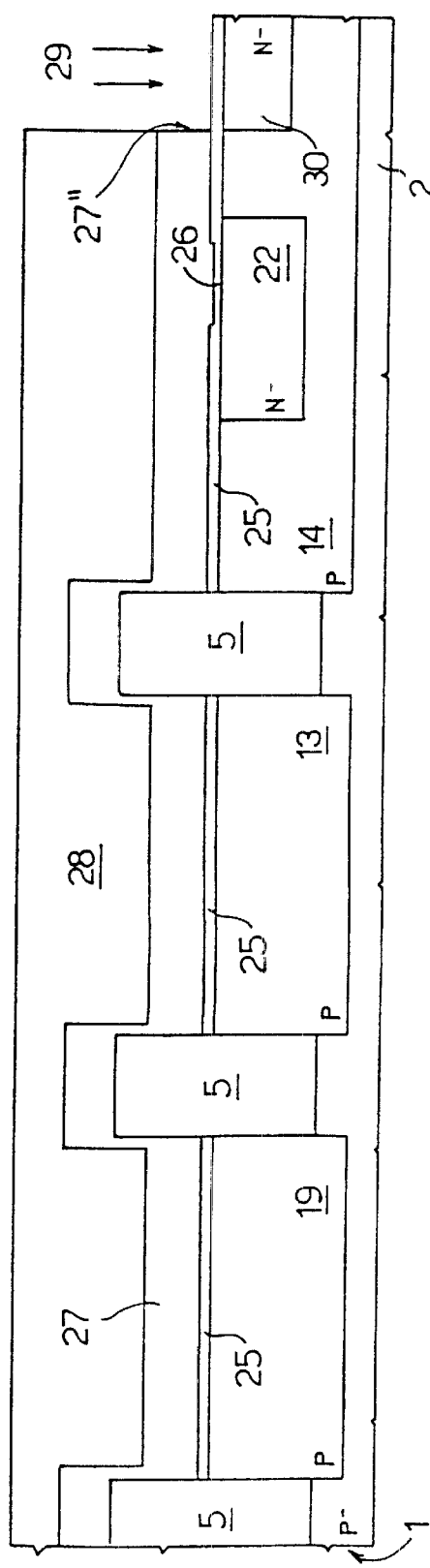
Figure 8:
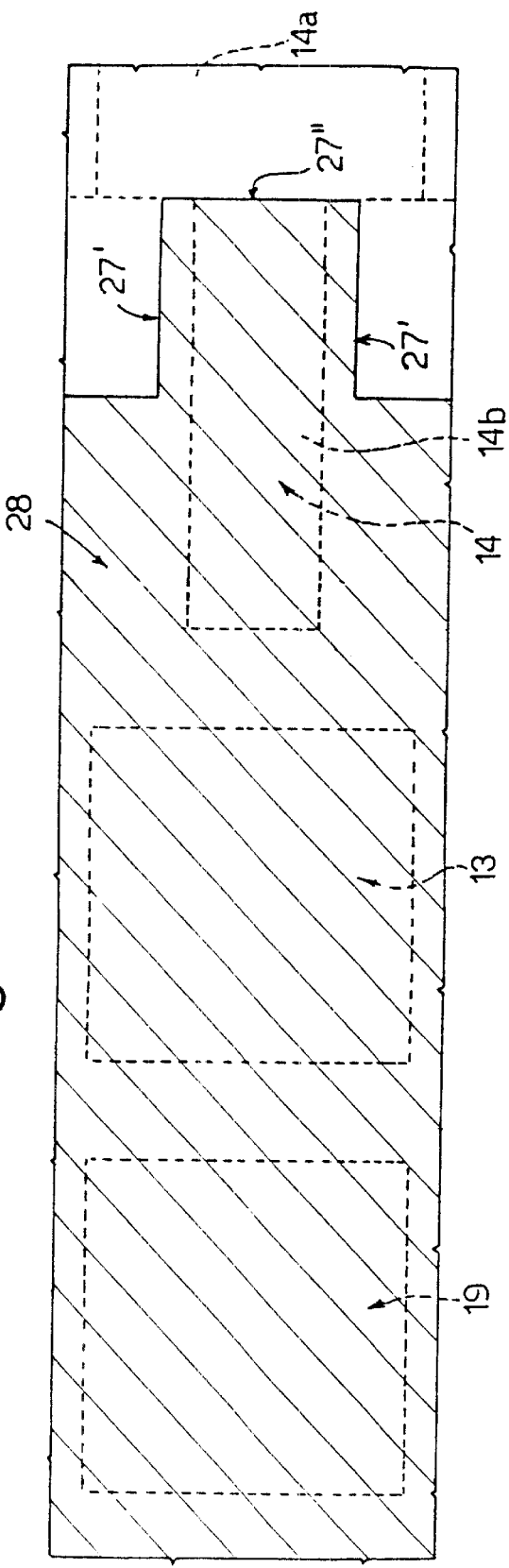
FIG. 8 shows a view from above of the wafer of FIG. 7.

A first polycrystalline silicon layer (poly1 layer 27) is then deposited, and is suitably doped; a floating gate mask 28 is then formed which covers all the surface of wafer 1, except for windows that expose legs 14a (FIG. 8) and the field oxide regions 5, laterally to the cross-pieces 14b adjacent to the legs 14a, as shown in FIG. 8. Then, through the floating gate mask 28, poly1 layer 27 is removed where it is exposed. In particular, the portions of poly1 layer 27 removed laterally to the cross-pieces 14b, form vertical walls 27', which are arranged on two opposite sides of a quadrilateral, and the width of which (shown vertically in FIG. 8) defines the floating gate regions of the memory transistors, and the portions of the poly1 layer 27 removed from above the legs 14a form a vertical wall 27", which is disposed on a third side of the quadrilateral (FIG. 8). On the other hand, the poly1 layer 27 is not removed where the selection transistors are to be formed. Subsequently, implanting of doping ionic species of N-type is carried out, as shown schematically by arrows 29 in FIG. 7, to reduce the resistance of the source lines. First source regions 30 of the memory transistors are then formed, at the legs 14a of the P-array region 14, as shown in FIG. 7.

Figure 9:
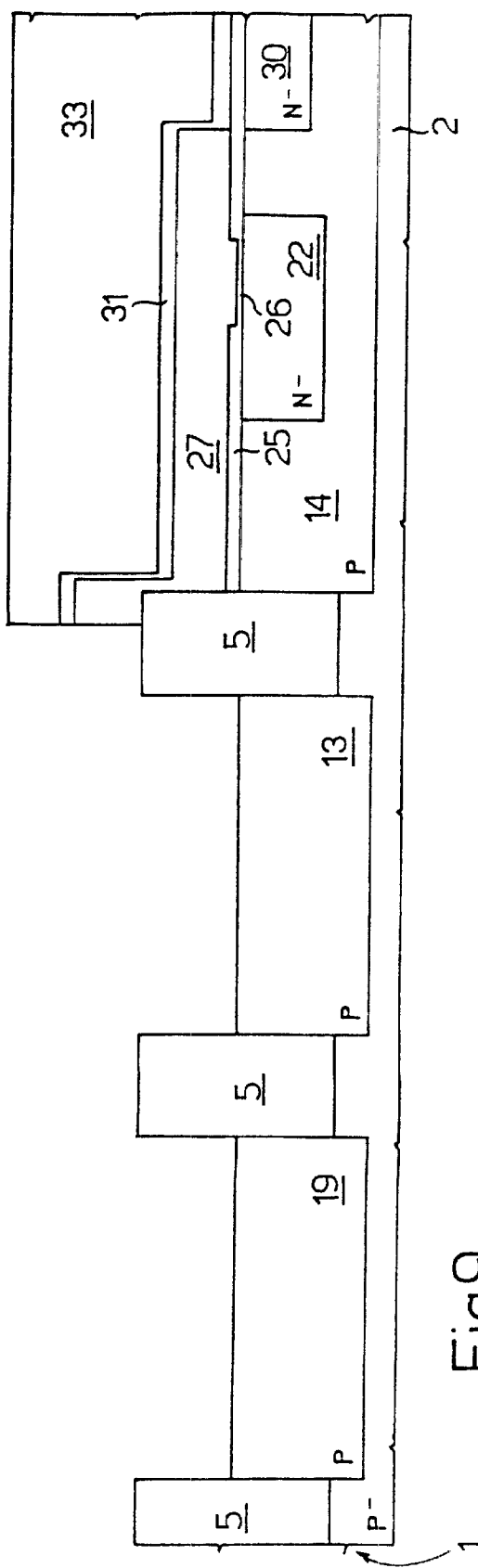

After the floating gate mask 28 has been removed, an interpoly dielectric layer 31 is formed, which for example comprising a triple layer of ONO (silicon oxide-silicon nitride-silicon oxide), which, inter alia, covers the vertical walls 27' and 27" (FIG. 8) of poly1 layer 27, for electrically isolating the floating gate regions of adjacent cells. A matrix mask 33 is then formed, which covers the surface of wafer 1, at the array zone 14, and leaves exposed all the N and P regions designed to accommodate LV and HV, NMOS and PMOS transistors, including regions P-HV 13 and P-LV 19; using the matrix mask 33, interpoly dielectric layer 31, poly1 layer 27, and array oxide layer 25 are etched in succession, where they are exposed. Thus the structure of FIG. 9 is obtained.

Figure 10:
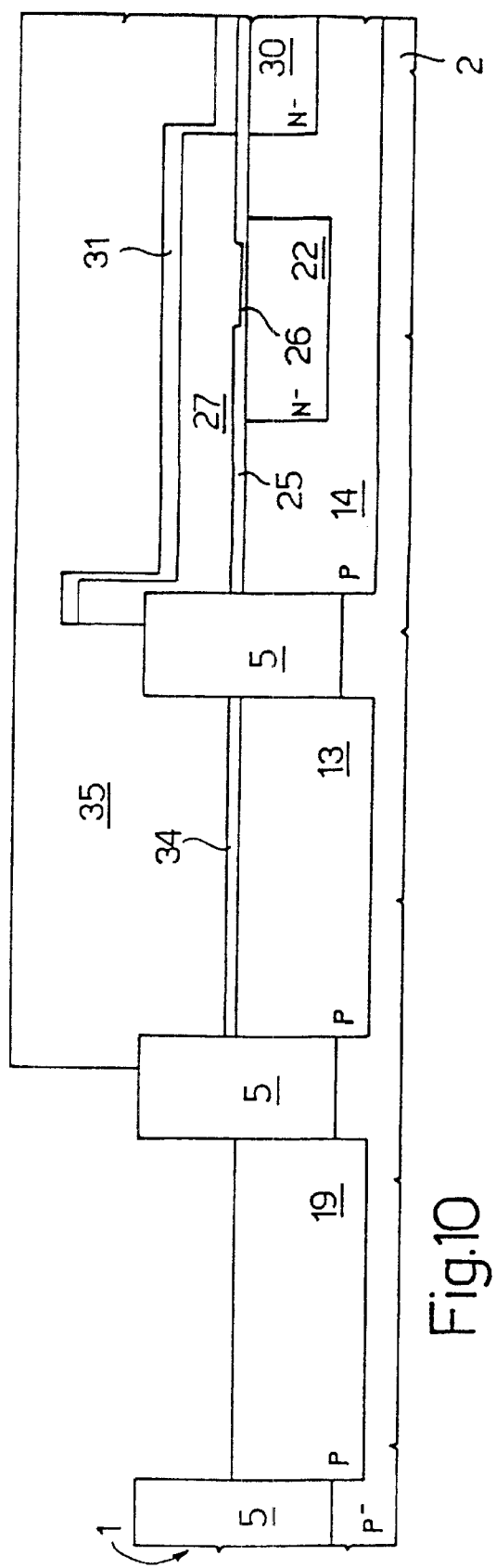

After matrix mask 33 has been removed, an HV oxidation step is carried out, thus forming an HV gate oxide layer 34 on the entire free surface of the substrate 2, and in particular on regions P-LV 19 and P-HV 13. A thin oxide layer (not shown) is also formed on the interpoly dielectric layer 31. Subsequently, using an HV resist oxide mask 35, which covers regions P-HV 13 and array zone 15, the HV gate oxide layer 34 is removed from above the regions P-LV 19, as shown in FIG. 10.

After the HV oxide mask 35 has been removed, an LV oxidation step is carried out, thus forming an LV gate oxide layer 36 on regions P-LV 19, increases the thickness of the HV gate oxide layer 34 on regions P-HV 13, and (with the layer previously formed), forms a thin oxide layer 38 on the interpoly dielectric layer 31 in the array zone 15. Subsequently, a select mask 39 is formed, which covers completely the zones designed to accommodate LV and HV, NMOS and PMOS transistors, as well as, in the array zone 15, cross-pieces 14b and portions of legs 14a, as shown in FIG. 12. In practice, select mask 39 exposes most of the first cell source regions 30 and pairs of zones 40 (FIG. 12) of wafer 1, which are arranged on both sides of the free end portion of each cross-piece 14b. Using select mask 39, the exposed portions of thin oxide layer 38, interpoly dielectric layer 31, and poly1 layer 27, are removed in succession. The dimensions of select mask 39 are such as to leave portions 31a of dielectric layer 31 on the walls 27" of the poly1 layer 27, and to remove virtually all the rest of the dielectric layer 31 from above the array oxide layer 25. In addition, the pairs of zones 40 make it possible to obtain vertical walls 27a (FIG. 14), which are uncovered, for the purpose indicated hereinafter. The structure in FIG. 11 is thus obtained.

Figure 14:
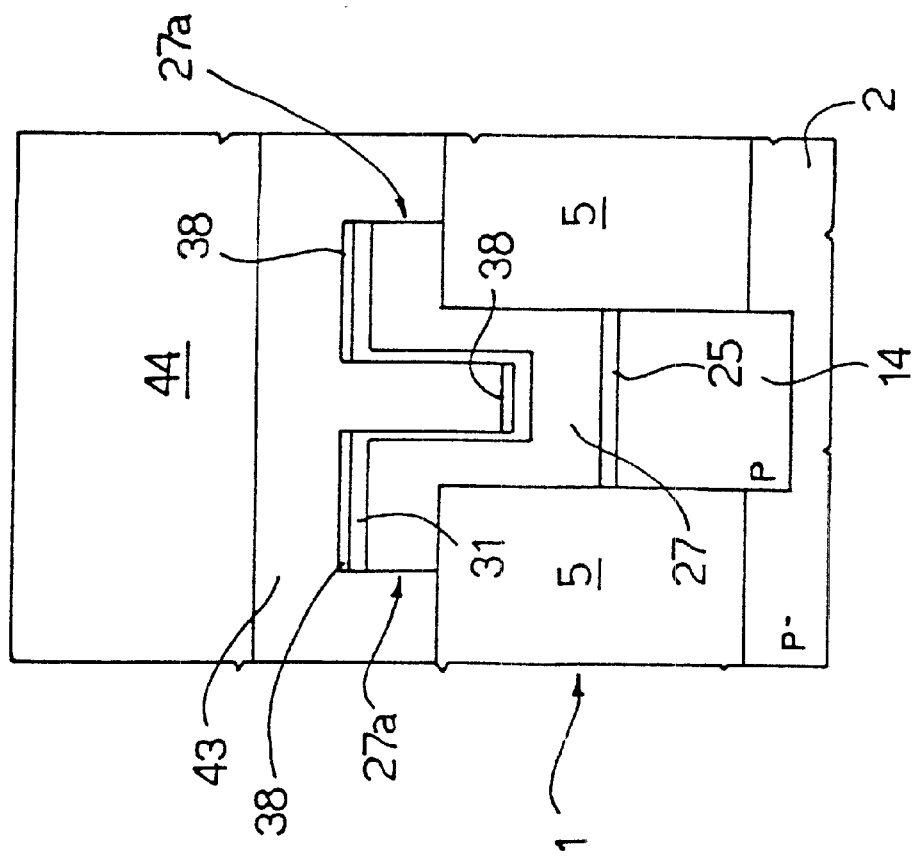
FIG. 14 is a cross-section, taken along lines XIII—XIII in FIG. 13.

After select mask 39 has been removed, a second polycrystalline layer (poly2 layer 43) is deposited and doped; owing to the removal of zones 40, poly2 layer 43 is in direct contact with the walls 27a of poly1 layer 27, as can be seen in the cross-section of FIG. 14. Thereby, lower and upper portions of the gate region of the selection transistor of the cell are shorted to one another. An LV gate mask 44 is then formed, which covers the regions N-HV (which are not shown), the regions P-HV 13, and the array zone 15, except for the first cell source regions 30; in addition, the LV gate mask 44 covers the poly2 layer on the regions P-LV 19, where the gate regions of the LV NMOS transistors are to be defined, as shown in FIGS. 13 and 15, and on the N-LV regions (which are not shown), where the gate regions of the LV PMOS transistors are to be defined. The exposed portions of poly2 layer 43 and of LV gate oxide layer 36 (as well as of thin oxide layer 38) are then removed, providing the intermediate structure of FIG. 13, wherein the remaining portions of poly2 on the regions P-LV 19 form gate regions 43a of the LV NMOS transistors. As shown, while defining the gate regions of the LV transistors, the layers over the regions P-HV 13 are protected, as are the layers on the regions N-HV (which are not shown); consequently, the method described provides separate definition of the gate regions of the LV transistors and the HV transistors.

After removal of LV gate mask 44, wafer 1 is subjected to oxidation, such that an oxide layer 46 grows on the exposed portions of regions P-LV 19, at the sides of gate regions 43a, on the exposed portions of the regions N-LV (which are not shown), on the poly2 layer, and on the second cell source regions 49. Using a resist mask, which is not shown, which covers the regions N-LV and N-HV, doping ionic species of N-type are implanted (LDDN implanting), as schematized by arrows 47 in FIG. 16. At the sides of the gate regions 43a (inside regions P-LV 19), LDD (lightly doped drain) regions 48 of N-type are then formed; inside the first cell source regions 30, aligned with the portions 31a of dielectric layer 31, second cell source regions 49 of N-type are formed, which are more highly doped than first cell source regions 30; in addition the poly2 layer 43 is suitably doped. The structure in FIG. 16 is thus obtained.

After the resist mask, not shown, has been removed, doping ionic species of P-type are implanted through a mask; in particular, during this step, regions P-HV 13 and P-LV 19, as well as array zone 15 are covered, whereas in the regions N-LV, LDD regions of P-type (which are not shown) are formed. A dielectric layer (for example TEOS-TetraEthylOrthoSilicate) is then deposited on the entire surface of wafer 1; then, in a known manner, the TEOS layer is subjected to anisotropic etching and is removed completely from the horizontal portions, and remains only at the sides of the gate regions 43a (where it forms spacers 52), and on the right-hand side of the poly1 layer 27 and poly2 layer 43 (on the first and second cell source regions 30, 49, where it forms spacers 53). On the other hand, spacers are not formed above the field oxide regions 5, since the edges of the latter have the shape of a bird's beak (formed in a per se known manner, not shown for the sake of simplicity); in addition, no spacers are formed above regions P-HV 13, and corresponding regions N-HV, since the gate regions of the HV transistors are not yet defined. Oxide layer 46 is also removed in this step. Subsequently, using a resist mask, not shown, which covers the regions N-LV and N-HV, implanting of doping ionic species of N-type is carried out, as schematized in FIG. 17 by arrows 54. LV-NMOS source and drain regions 55 of N+-type are then formed in regions P-LV 19, self-aligned with the spacers 52, and third cell source regions 56 of N+-type are formed, self-aligned with the spacers 53 in the P-array region 14. LV-NMOS source and drain regions 55 are more doped than LDD regions 48, and third source regions 56 are more doped than second cell source regions 49. In addition, poly2 layer 43 and gate regions 43a are doped of N-type, whereas the zones where HV and LV PMOS transistors are to be formed are covered. Then the structure of FIG. 17 is obtained.

Figure 18:
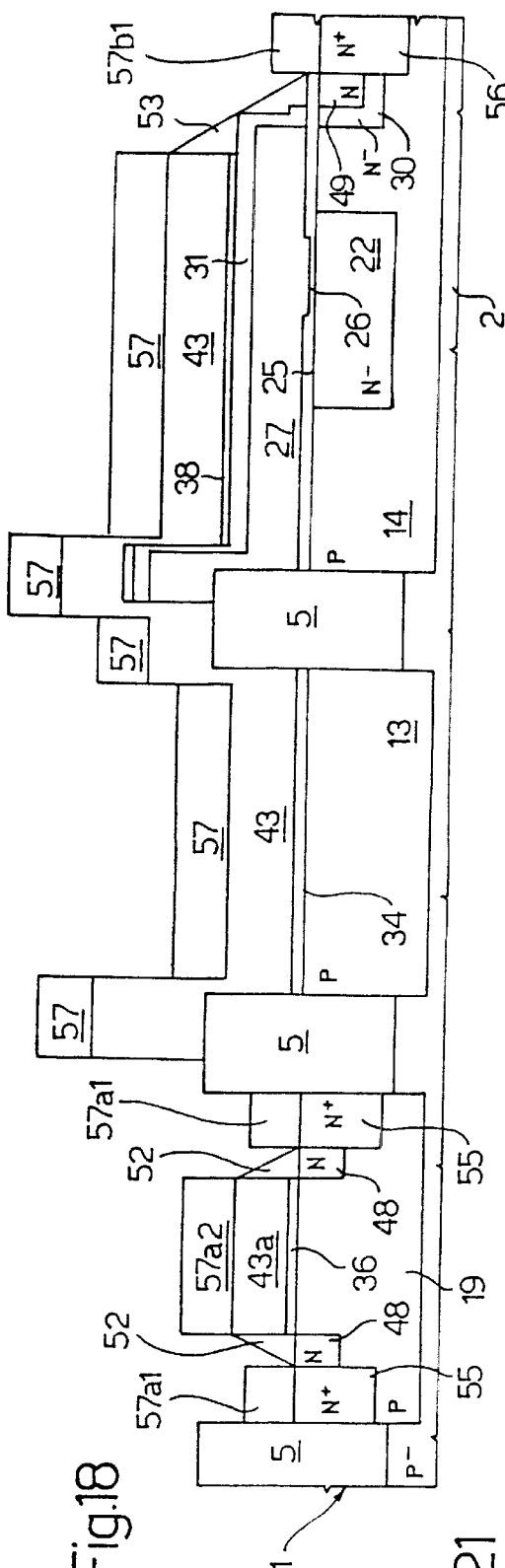

After the resist mask (not shown) has been removed, a similar step of masked implanting of doping ionic species of P-type is carried out, for forming the respective source and drain regions in the N-LV regions (in a not shown manner), and for P-type doping poly2 layer 43 above the regions P-LV and P-HV. In this step, the regions P-LV, P-HV and P-array are fully covered. Saliciding of the exposed layer of poly2 is then carried out. The saliciding, which is carried out in a known manner, as already described, causes the formation of regions of titanium silicide above the source and drain regions of LV NMOS and PMOS transistors (silicide regions 57a1 above LV-NMOS source and drain regions 55, and similar regions for the LV PMOS transistors), above the gate regions of LV NMOS and PMOS transistors (silicide regions 57a2 above gate regions 43a for the LV NMOS transistors, and similar regions for the LV PMOS transistors), above the third cell source regions 56 (silicide regions 57b1), and above the EEPROM cells and the HV zones (silicide regions 57, where the gate regions are not yet defined), as shown in FIG. 18.

Subsequently an HV gate mask 60 is formed, which covers the entire surface of wafer 1, with the exception of the active areas where high voltage transistors are to be formed (P-HV regions 13, in case of HV NMOS) and the EEPROM cells; in particular, mask 60 covers the zone where the gate regions of the high voltage transistors are to be defined; the gate regions of the selection transistors and the gate and source regions of the memory transistors (in this respect see also FIG. 20, which shows HV gate mask 60 from above). The portions of silicide layer 57 and of poly2 43 layer which are not covered by the HV gate mask 60 are then etched. Thus the structure of FIG. 19 is obtained, wherein the control gate region of the memory transistor is indicated at 43b, the upper portion of the gate region of the selection transistor (which is shorted to the lower portion, as already described) is indicated at 43c, and the gate region of the HV NMOS transistor is indicated at 43d; the corresponding portions of silicide are indicated at 57b2, 57c, and 57d. In practice, definition of the regions 43b, 43c and 43d takes place after saliciding, and causes removing the salicide (with the layer of poly2 43), on the high voltage junctions on which silicide must not be present.

Figure 21:
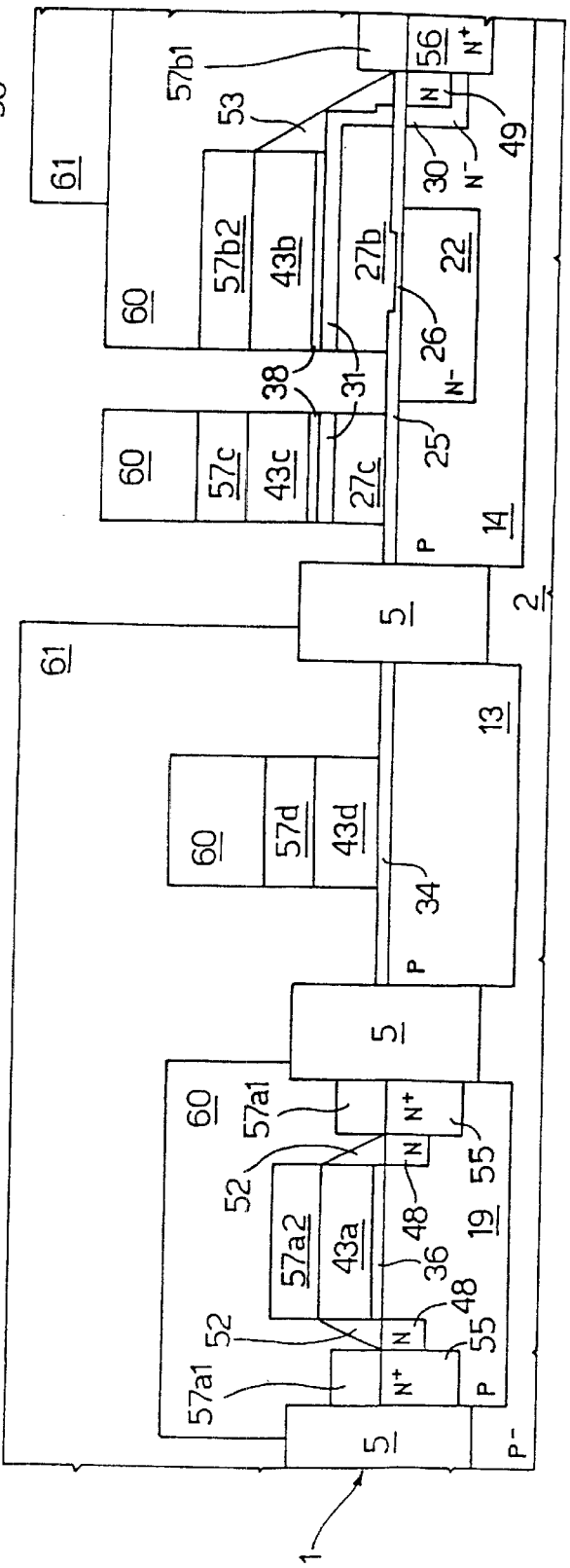
FIGS. 21–23 show cross-sections similar to FIG. 19, in successive manufacturing steps.

Without removing the HV gate mask 60, a self-aligned mask 61 is formed, which covers completely the zone of the LV and HV, NMOS and PMOS transistors, and the zones above the cell source regions 30, 49, 56 of the cells; using the two masks, i.e., HV gate mask 60 and self-aligned mask 61, the exposed portions of thin oxide layer 38, interpoly dielectric layer 31, and poly1 layer 27 are etched. Thus floating gate regions 27b of the memory transistors and lower portions 27c of the selection transistors are formed, as can be seen in FIG. 21. In practice, while defining the gate regions 27b and 27c, the cell source regions 30, 49 and 56 are covered, and are therefore not aligned with the gate regions 27b and 27c.

Figure 22:
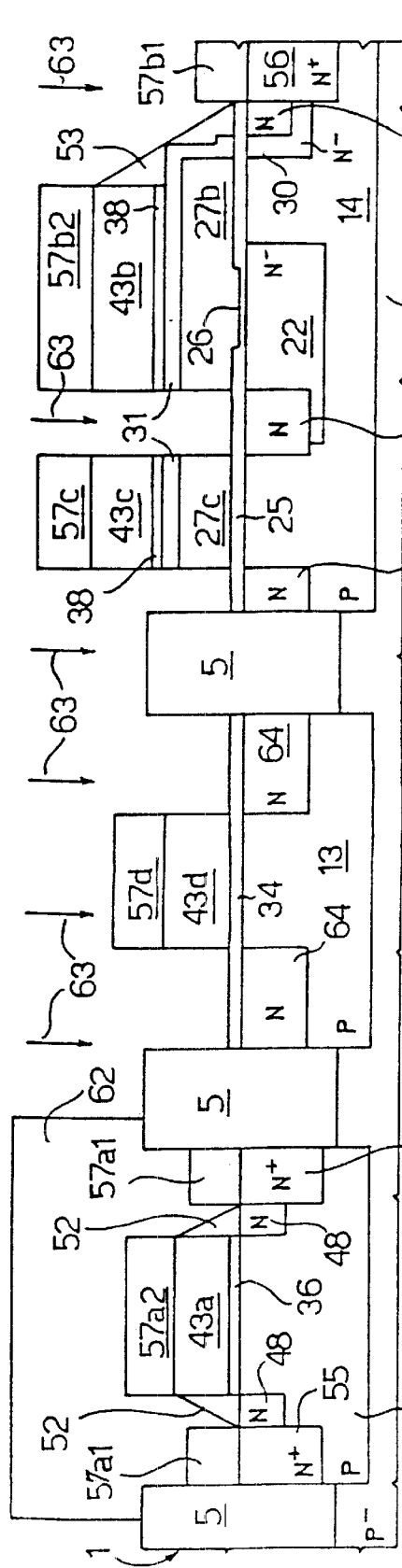

After HV gate mask 60 and self-aligned mask 61 have been removed, an NHV mask 62 is formed, which covers the regions N-LV and N-HV (which are not shown), and the regions P-LV 19. Using NHV mask 62, doping ionic species of N-type are implanted, as shown schematically in FIG. 22 by arrows 63. In the regions P-HV 13, at both sides of the HV gate regions 43d, HV-NMOS source and drain regions 64 of N-type are thus formed, which are less doped than LV-NMOS source and drain regions 55; simultaneously, in P-array region 14, selection source and drain regions 65a, 65b are formed on both sides of the cell, including upper portion 43c and lower portion 27c of the gate region of the selection transistors. Selection source and drain regions 65a, 65b (as well as HV-NMOS source and drain regions 64)

have a doping level lower than LV-NMOS source and drain regions 55, and than third cell source regions 56, and thus they have a higher breakdown voltage, as well as greater resistivity.

Figure 23:
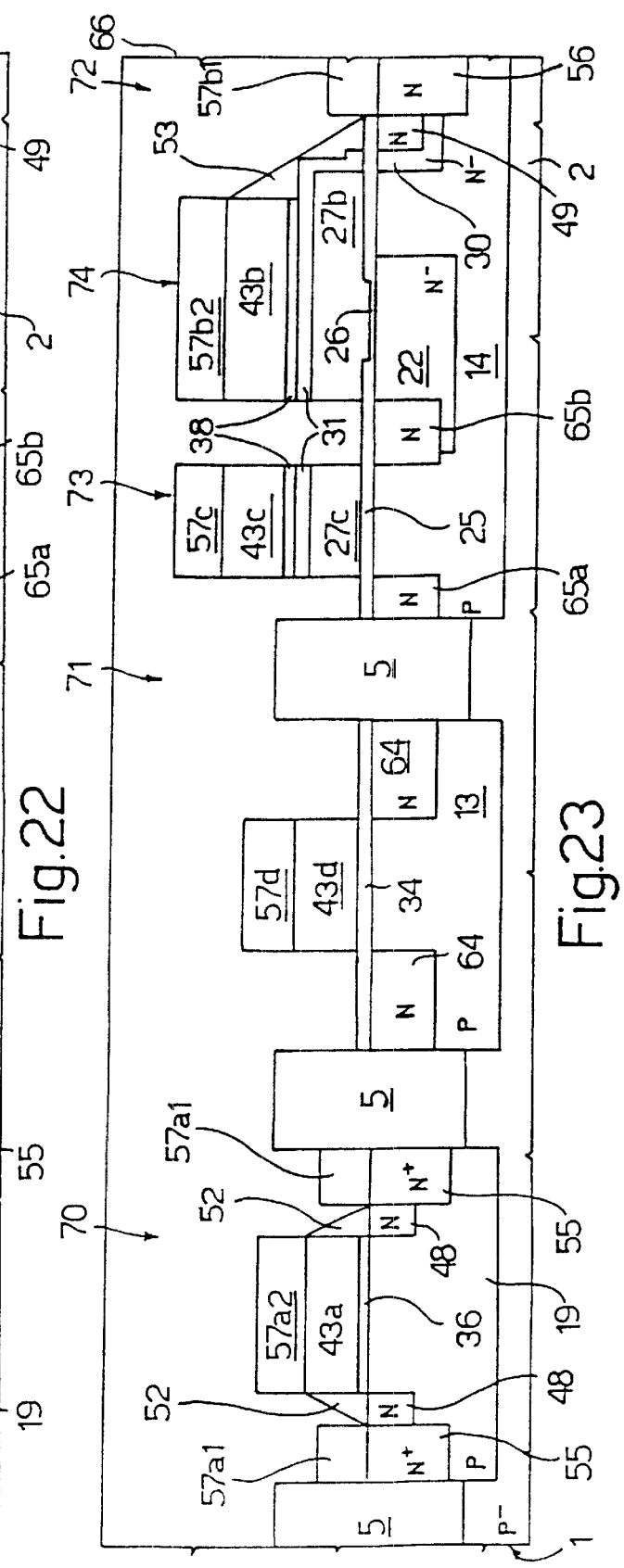

After NHV mask 62 has been removed, the source and drain regions of the HV PMOS transistors (which are not shown) are similarly masked implanted; a protective dielectric layer 66 is then deposited, providing the structure of FIG. 23, wherein an LV NMOS transistor 70, an HV NMOS transistor 71, and an EEPROM cell 72, comprising a selection transistor 73 and a memory transistor 74, are shown. Final steps then follow, including forming contacts and electrical interconnection lines, depositing a passivation layer etc.

Thus, in the final device, EEPROM cells 72 have selection source and drain regions 65 with high breakdown voltages; third source regions 56 (which form source lines) which are planar (unlike those obtained by known self-aligned processes, wherein the etching for defining the cell gate regions gives rise to trenches in substrate 2); first source regions (LDD cell regions) 30, self-aligned with the floating gate regions 27b; source lines 56, control gate lines 43b, and upper portions 43c of the gate regions of the selection transistors 73 with low resistivity; control gate regions 43b and floating gate regions 27b self-aligned on a single side (towards the regions 65b which define the drain regions of the memory transistors 74 and the source regions of the selection transistors 73); and gate regions of the selection transistors 73, formed by a structure with two polysilicon levels which are shorted to one another.

After NHV mask 62 has been removed, the source and drain regions of the HV PMOS transistors (which are not shown) are similarly masked implanted; a protective dielectric layer 66 is then deposited, providing the structure of FIG. 23, wherein an LV NMOS transistor 70, an HV NMOS transistor 71, and an EEPROM cell 72, comprising a selection transistor 73 and a memory transistor 74, are shown. Final steps then follow, including forming contacts and electrical interconnection lines, depositing a passivation layer etc.

Thus, in the final device, EEPROM cells 72 have selection source and drain regions 65 with high breakdown voltages; third source regions 56 (which form source lines) which are planar (unlike those obtained by known self-aligned processes, wherein the etching for defining the cell gate regions gives rise to trenches in substrate 2); first source regions (LDD cell regions) 30, self-aligned with the floating gate regions 27b; source lines 56, control gate lines 43b, and upper portions 43c of the gate regions of the selection transistors 73 with low resistivity; control gate regions 43b and floating gate regions 27b self-aligned on a single side (towards the regions 65b which define the drain regions of the memory transistors 74 and the source regions of the selection transistors 73); and gate regions of the selection transistors 73, formed by a structure with two polysilicon levels which are shorted to one another.

The LV (NMOS and PMOS) transistors have a high-speed LDD structure with a dual gate (gate region 43a doped with doping ionic species of the same type as source and drain regions 48, 55); with salicized source and drain regions 55 and gate region 43a.

The HV (NMOS and PMOS) transistors have a dual gate and drain extension structure, with salicized gate region 43d alone.

The described method thus allows simultaneous production of LV, HV and memory components which have very different characteristics, optimizing the number of necessary steps.

Finally, it is apparent that many modifications and variations can be made to the method and the device described and illustrated here, all of which come within the scope of the invention, as defined in the attached claims.

What is claimed is:

1. A method for manufacturing electronic devices, memory cells and low voltage (LV) transistors with salicided junctions, comprising:
   depositing an upper layer of polycrystalline silicon;
   defining the said upper layer to obtain LV gate regions and undefined portions;
   forming LV source and drain regions laterally to said LV gate regions;
   forming a silicide layer on said LV source and drain regions, on said LV gate regions, and on said undefined portions; and
   defining cell gate regions.

2. The method of claim 1, further comprising forming HV transistors, and wherein defining cell gate regions further comprises defining HV gate regions.

3. The method of claim 2, further comprising, before depositing an upper layer:
   forming first gate oxide regions on first areas of a substrate of monocrystalline silicon;
   forming polycrystalline silicon regions on said first gate oxide regions;
   forming dielectric regions on said polycrystalline silicon regions;
   forming second gate oxide regions on second areas of said substrate, and third gate oxide regions on third areas of said substrate;
   wherein said LV gate regions extend on said second areas and said undefined portions extend on said first and said third areas;
   and wherein defining gate regions of cells comprises:
      removing selective portions of said silicide layer and of said upper layer from above said first and third areas, such as to form said HV gate regions on said third areas, as well as upper gate structures on said first areas;
      removing selective portions of said dielectric layer and of said polycrystalline silicon regions from above said first areas, in an aligned manner with said upper gate structures;
   the method then further comprising forming HV source and drain regions in said third areas adjacent to said HV gate regions, and cell source and drain regions in said first areas adjacent to said upper gate structures.

4. The method of claim 3, wherein said memory cells are EEPROM cells comprising a selection transistor and a memory transistor,
   wherein forming first gate oxide regions further comprises forming continuity regions in said first areas, and providing tunnel oxide regions on said continuity regions;
   wherein forming dielectric regions further comprises removing selective portions of said dielectric regions such that, during depositing an upper layer, areas of contact are formed between said polycrystalline regions and said upper layer;
   and simultaneously with forming LV source and drain regions, forming a source region of said memory transistor;
   and wherein removing selective portions of said silicide layer further comprises defining two sides of upper gate portions of said selection transistor, and one side of control gate regions of said memory transistor;

and wherein removing selective portions of said dielectric layer is carried out in an aligned manner with said two sides of said upper gate portions of said selection transistor and with said side of said control gate regions such as to form lower gate portions of said selection transistors, shorted to said upper gate portions and floating gate regions of said memory transistor;

and wherein forming HV and cell source drain regions further comprises the step of forming source and drain regions of said selection transistor.

5. The method of claim 4, further comprising forming said source region of said memory transistor, said source and drain regions of said selection transistor, and said LV and HV source and drain regions to have a first conductivity type, and further comprising, before forming first gate oxide regions:

first selective implanting of doping ionic species of a second conductivity type in said first and third areas of said substrate;

second implanting, separate from the first implanting, of doping ionic species of said second conductivity type in said second areas of said substrate which do not cover said first and third areas.

6. The method of claim 4, wherein forming polycrystalline silicon regions comprises:

depositing a lower layer of polycrystalline silicon;

removing said lower layer completely from above said second and third areas, and removing selective portions of said lower layer from above said first areas, such as to form a first, a second and a third side of a quadrilateral, said first and second sides being opposite to one another, and said third side extending between said first and second sides of said quadrilateral; and forming lightly doped drain (LDD) cell regions in said first areas, laterally to said third side of said quadrilateral, said LDD cell regions being spaced from said regions of continuity;

and further comprising forming said dielectric regions to cover said first, second and third sides of said quadrilateral.

7. The method of claim 4, further comprising, simultaneously with removing selective portions of said dielectric regions, removing selective portions of said dielectric layer from above said first areas, and laterally to said polycrystalline silicon regions, and after defining said upper layer, and before forming LV source and drain regions, further comprising:

implanting doping ionic species in said LV gate regions, in said undefined portions, and in said first and third areas, and forming LV LDD regions aligned with said LV gate regions in said second areas, and intermediate cell source regions in said first areas, aligned with said dielectric layer, said intermediate cell source regions being intended to laterally surround said source regions of said memory transistor; and forming first and second spacers laterally to said LV gate regions, respectively laterally to said dielectric layer on said first areas;

and wherein forming LV source and drain regions and source regions of said memory transistor are carried out aligned with said first and second spacers.

8. A method for manufacturing electronic devices having memory cells and transistors with salicided junctions, comprising:

forming active area array regions of a first conductivity and active area regions of low voltage (LV) conductivity in a substrate;

defining LV gate regions on the active area regions of LV conductivity;

forming LV source and drain regions laterally to the LV gate regions in the active area regions of LV conductivity;

forming a silicide layer on the LV source and drain regions, on the LV gate regions, and on the active area array regions; and defining memory cell gate regions in the active area array regions.

9. The method of claim 8, wherein forming active area array regions further comprises forming an area active region of high voltage (HV) conductivity, and defining cell gate regions further comprises defining HV gate regions.

10. A method for manufacturing electronic devices having memory cells and low voltage (LV) and high voltage (HV) transistors, comprising:

forming an active region of LV conductivity in a first area in a silicon substrate, and an active HV region and an active array region of a second conductivity in second and third areas in the substrate of silicon, respectively;

forming a first gate oxide region on the third area;

forming a polycrystaline silicon region on the first gate oxide region;

forming a dielectric region on the polycrystaline silicon region;

forming a second gate oxide region on the second area of the substrate and a third gate oxide region on the first area of the substrate;

depositing an upper layer of polycrystaline silicon over selected regions of the first, second, and third areas;

defining an LV gate region in the third area;

forming LV source and drain regions laterally to the LV gate region;

forming a silicide layer on the LV source and drain region, on the LV gate region, and on the upper layer of polycrystaline silicon on the first and second regions; and defining HV gate regions in the second region and cell gate regions in the third region.

11. The method of claim 10, wherein defining the cell gate regions comprises:

removing selected portions of the silicide layer and the upper layer of polycrystaline silicon from above the second and first areas to form the high voltage (HV) gate region on the second area and upper gate structures on the first area; and removing selected portions of the dielectric layer and the polycrystaline silicon regions from above the third area in an aligned manner with the upper gate structures.

12. The method of claim 11, further comprising forming HV source and drain regions in the second area adjacent to the HV gate regions and cell source and drain regions in the third area adjacent to the upper gate structures.

* * * * *